United States Patent [19]

Enomoto

[11] Patent Number: 5,321,297
[45] Date of Patent: Jun. 14, 1994

[54] SOLID STATE IMAGE PICKUP DEVICE HAVING LIGHT CONVERSION LENS FORMED ON A STRIP LAYER

[75] Inventor: Tadashi Enomoto, Yokohama, Japan
[73] Assignee: Kabushiki Kaisha Toshiba, Kawasaki, Japan
[21] Appl. No.: 910,147
[22] PCT Filed: Nov. 15, 1991
[86] PCT No.: PCT/JP91/01567
    § 371 Date: Jul. 16, 1992
    § 102(e) Date: Jul. 16, 1992
[87] PCT Pub. No.: WO92/09105
    PCT Pub. Date: May 29, 1992
[30] Foreign Application Priority Data
    Nov. 16, 1990 [JP] Japan .................. 2-310942
[51] Int. Cl.$^5$ .................. H01L 29/78; H01L 23/29; H01L 25/04
[52] U.S. Cl. .................. 257/432; 257/435; 257/436; 257/443; 359/619
[58] Field of Search .............. 257/432, 435, 436, 443, 257/445; 359/619

[56] References Cited

U.S. PATENT DOCUMENTS

| | | | |
|---|---|---|---|
| 4,694,185 | 9/1987 | Weiss | 257/436 |
| 4,959,533 | 9/1990 | Yamazaki et al. | 257/436 |
| 5,118,924 | 6/1992 | Mehra et al. | 257/432 |
| 5,132,251 | 7/1992 | Kim et al. | 257/432 |
| 5,151,790 | 9/1992 | Takatori et al. | 359/619 |
| 5,172,206 | 12/1992 | Iizuka | 257/435 |

FOREIGN PATENT DOCUMENTS

| | | | |
|---|---|---|---|
| 332069 | 2/1991 | Japan | 257/435 |
| 3190169 | 8/1991 | Japan | 257/432 |

OTHER PUBLICATIONS

Patent Abstracts of Japan, vol. 14, No. 108 (E-896) 27 Feb. 1990 and JP-A-1 309 370 (NEC Corp) 13 Dec. 1989.
IEEE Transactions on Consumer Electronics, vol. CE-31, No. 2, May 1985, New York US pp. 88-95; H. Saeki et al., Effect of Microlens Array for Mos Color Imager.

*Primary Examiner*—Rolf Hille
*Assistant Examiner*—Mahshid Saadat
*Attorney, Agent, or Firm*—Foley & Lardner

[57] ABSTRACT

Light is directed to each photosensitive section by independently adjusting the curvature or thickness of each light converging lens above the photosensitive section, irrespective of the shape of a photosensitive element (photosensitive section), i.e., irrespective of the shape having a longer side in the row direction than the side in the column direction. Specifically, a strip layer is formed above a plurality of photosensitive sections, disposed in a row direction. Light converging lenses are formed on each strip layer to obtain a desired curvature or thickness.

11 Claims, 11 Drawing Sheets

SOLID STATE IMAGE PICKUP DEVICE HAVING LIGHT CONVERSION LENS FORMED ON A STRIP LAYER

FIELD OF THE INVENTION

The present invention relates to a solid state image pickup device and a method of manufacturing the same.

BACKGROUND OF THE INVENTION

A solid state image pickup device is constructed of a plurality of pixels of image pickup elements, each having a photosensitive section. In each image pickup element, light incident to a light receiving section is converted into electric charge signal by the photosensitive section (e.g., a photodiode). This electric charge signal is outputted from a charge transfer section of the solid state image pickup device.

As a method of improving the light reception sensitivity of such a solid state image pickup device without enlarging any light receiving section, a light converging lens is mounted above a photodiode (photosensitive section) to converge external light onto the photosensitive section.

A conventional method of manufacturing a solid state image pickup device having a light converging lens will be described with reference to FIGS. 13A to 13D.

Figure 13A:
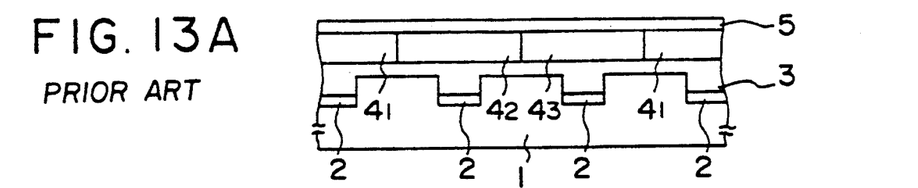
FIGS. 13A-13D and 14A-14D are cross sectional views showing the processes of manufacturing conventional solid state image pickup devices.

As seen from FIG. 13A, a plurality of photosensitive sections (photodiodes) 2 are first formed on the surface of a semiconductor substrate 1 at predetermined areas. The surface of each photodiode 2 is covered with a passivation film 3. Color filters $4_1$, $4_2$ and $4_3$ are formed on the surface of the passivation film 3, using a dying film such as gelatin. The color filters $4_1$, $4_2$ and $4_3$ are red, green, and blue, respectively. A passivation film 5 is deposited on the surface of these color filters $4_1$, $4_2$ and $4_3$.

Figure 13B:
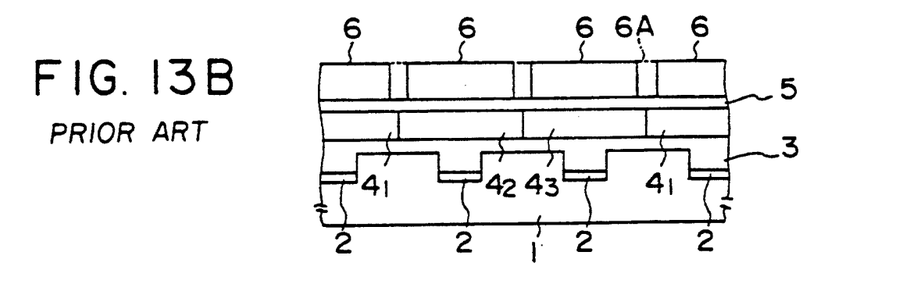

Next, as seen from FIG. 13B, a photoresist film 6A is formed over the whole surface of the passivation film 5. The photoresist film 6A is patterned to form a photoresist film 6 above each photodiode 2.

Figure 13C:
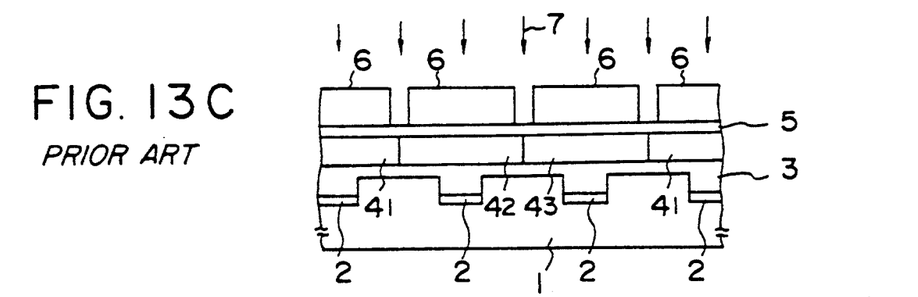

Thereafter, as shown in FIG. 13C, light 7 is applied to the photoresist films 6 to make them transparent.

Figure 13D:
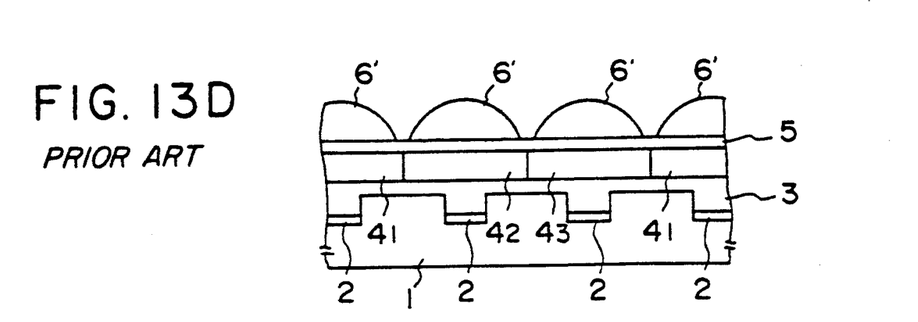

Then, as shown in FIG. 13D, the transparent films 6 are thermally deformed to form light converging lenses 6'.

Figure 11A:
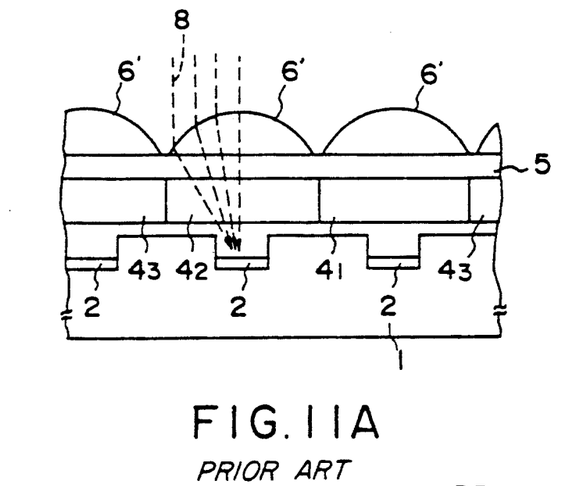
FIG. 11A is a cross sectional view along line $A_5-A_{5'}$ of a conventional solid state image pickup device.
Figure 11B:
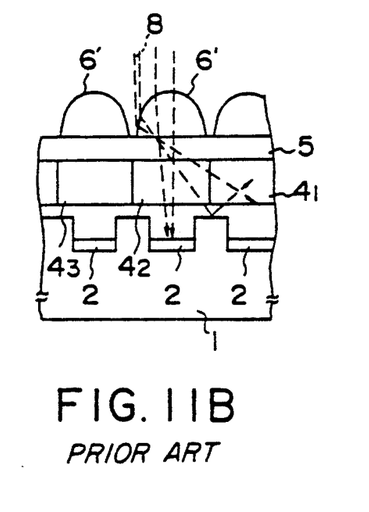
FIG. 11B is a cross sectional view along line $B_5-B_{5'}$ of the conventional solid state image pickup device.
Figure 11C:
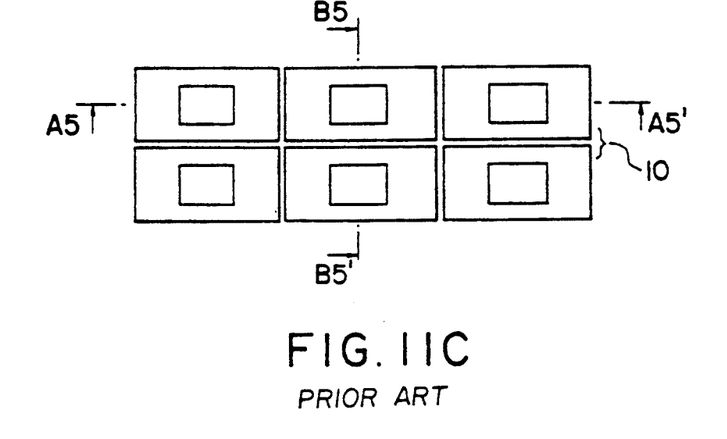
FIG. 11C is a plan view of the conventional solid state image pickup device.

FIGS. 11A to 11C show a conventional solid state image pickup device manufactured by the above-described method. FIG. 11C is a plan view, FIG. 11A is a cross sectional view taken along the $A_5$–$A_{5'}$ of FIG. 11C, and FIG. 11B is a cross sectional view taken along line $B_5$–$B_{5'}$ of FIG. 11C. FIG. 11A corresponds to FIG. 13D.

Another conventional manufacturing method will be described with reference to FIGS. 14A to 14D.

The processes up to forming a passivation film 5 shown in FIG. 11A are the same as those described with FIG. 13A. A transparent film 106 to form light converging lenses 106' (refer to FIG. 14D) is formed on the passivation film 5.

Figure 14A:
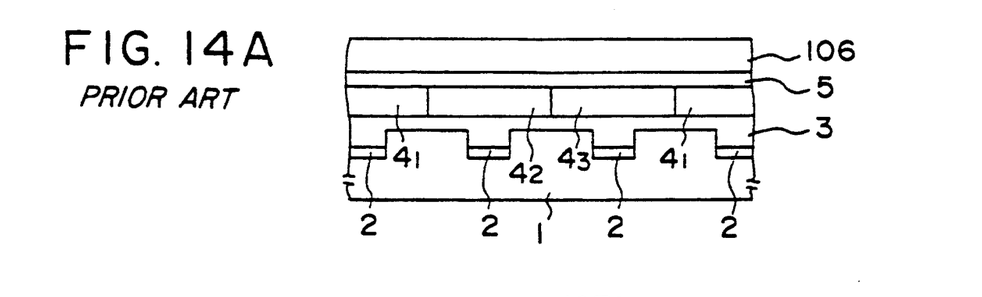
Figure 14B:
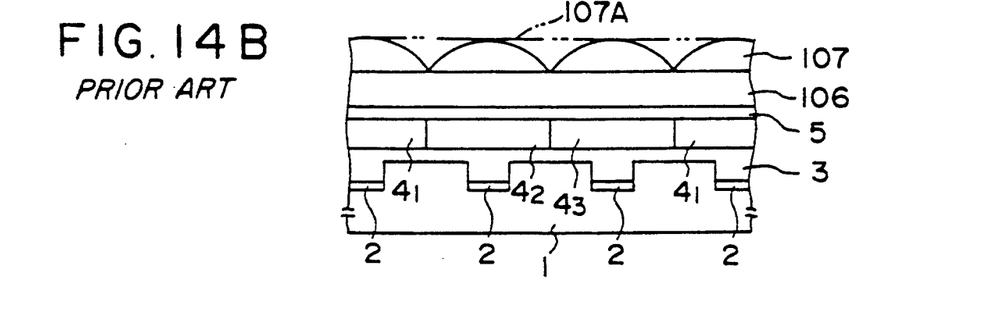
Figure 14C:
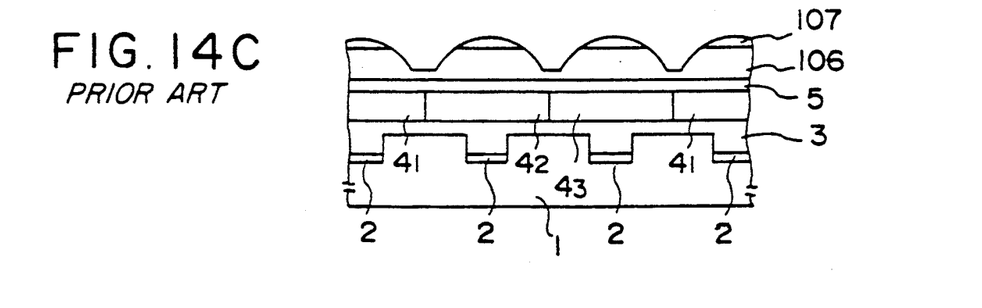
Figure 14D:
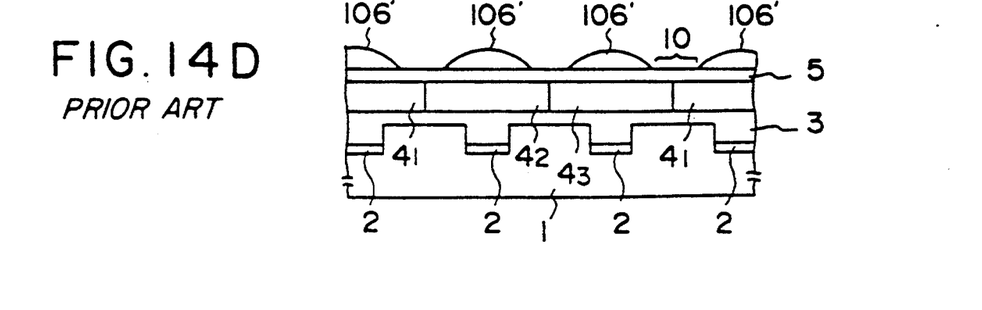

Next, as seen from FIG. 14B, a photoresist layer 107A is formed on the transparent film 106. The photoresist layer 107A is patterned by means of a photoetching method, to form a photoresist film 107 patterned so as to form light converging lenses. Thereafter, as seen from FIG. 14C and 14D, the transparent film 106 and photoresist film 107 are etched by means of an anisotropic etching (e.g., RIE). The shape of the photoresist film 107 is therefore transferred to the transparent film 106 to form the light converging lenses 106'. The plan view and cross sectional view along line $B_5$–$B_{5'}$, of this device are shown in FIGS. 11C and 11B.

Figure 12:
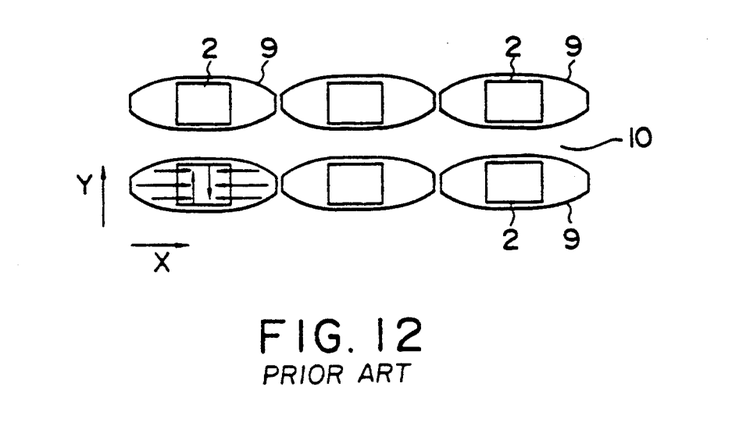
FIG. 12 is a plan view explaining the disadvantages of the conventional solid state image pickup device.

As shown in FIG. 14B, the photoresist film 107 of a solid state image pickup device manufactured by the method explained with FIGS. 14A to 14D is formed on a flat passivation film 5. Therefore, the film thickness is substantially the same both in the X- and Y-directions. Thus, the curvatures in the X- and Y-directions are determined by the shape of the photoresist film 107 patterned so as to form the light converging lenses. The light convergence efficiency in the direction along line $A_5$–$A_{5'}$ of the light converging lens 6' (106') shown in FIG. 11A is good because light is refracted by the light converging lens 6' and directed to the center of the photodiode 2. However, the light convergence efficiency in the direction along line $B_5$–$B_{5'}$ is not so good because of a so-called "circular aberration" phenomenon caused by a larger curvature at the plane along line $B_5$–$B_{5'}$ of the light converging lens 6' (106') than that along line A—A. Specifically, as seen from FIG. 12 showing the lens effects, light in the Y-direction (B—B direction) can be sufficiently converged, but light in the X-direction (A—A direction) cannot be sufficiently converged. Therefore, an effective light convergence area 9 becomes small. In other words, the light convergence of the light converging lens 6 becomes small.

If the curvature is set so that light in the Y-direction can be sufficiently converged, the length of each pixel becomes greater in the X-direction than in the Y-direction. Therefore, contrary to the above-described case, light in the X-direction cannot be sufficiently converged. Most of light near each photodiode accordingly cannot be used. This is serious particularly for a PAL method having more pixels in the vertical direction than the horizontal direction.

As described above, a conventional device cannot obtain a sufficiently large effective light convergence area 9 (FIG. 12). Therefore, if the ratio of an X-direction width to a Y-direction width of the micro light converging lens 6' (106') changes, the light converging lens effects in the Y-direction may disappear in some cases. Namely, both opposite areas in the Y-direction of the photodiode 2 may become an invalid light convergence area 10. As a result, light incident on the invalid light convergence area 10 may enter adjacent photodiodes, resulting in a problem of increased color crosstalk, smear, and the like.

It is conceivable that the curvature is made small by thinning the film thickness of the light converging lens 6' (106') at the cross section in the Y-direction or along line $B_5$–$B_{5'}$. However, this essentially makes small the curvature of the light converging lens at the cross section in the X-direction or along line $A_5$–$A_{5'}$. The effective light convergence area therefore becomes small. If the length in the X-direction of the photodiode is made large to compensate for the reduced effective light convergence area, the problem of increased smear will occur.

SUMMARY OF THE INVENTION

The present invention has been made in consideration of the above circumstances. It is therefore an object of the present invention to provide a solid state image pickup device and a method of manufacturing the same, capable of obtaining a high light reception sensitivity irrespective of the size of each pixel.

According to the solid state image pickup device of the present invention, a suitable curvature or thickness of a light converging lens is set. Therefore, light incident to the light converging lens either in the row direction or in the column direction, can be converged efficiently to the corresponding photosensitive section, considerably improving the light reception sensitivity.

According to the method of manufacturing a solid state image pickup device of the present invention, a strip layer is formed above photosensitive sections disposed in the column line to form light converging lenses by directly or indirectly using the strip layer. Therefore, it is possible to control the curvature or thickness of a light converging lens independently at cross sections in the row and column directions, and to obtain a solid state image pickup device capable of efficiently converging incident light in the row and column directions to the photosensitive section.

In the solid state image pickup device of the present invention, photosensitive sections of respective solid state image pickup elements are disposed in a matrix shape, and each light converging lens is positioned above each photosensitive section. The curvatures of each light converging lens, i.e., a first curvature at the cross section in the row direction of the matrix and a second curvature at the cross section in the column direction, are set to such values that light incident to each light converging lens in the row and column directions is directed to the corresponding photosensitive section. Therefore, irrespective of the shape of a photosensitive section, for example, irrespective of different side lengths in the row and column directions, light incident to each light converging lens in the row and column directions is directed to the corresponding photosensitive section.

According to another solid state image pickup device of the present invention, a desired thickness of a light converging lens is set. Therefore, light incident to each light converging lens in the row and column directions is directed to the corresponding photosensitive section, similar to the above-described device, irrespective of the shape of a photosensitive section, for example, irrespective of the side lengths in the row and column directions.

According to a method of manufacturing a solid state image pickup device of the present invention, a strip layer is formed above a plurality of photosensitive sections disposed in the row direction. An outer portion of each light converging lens is formed on the strip layer. Therefore, the curvature of each light converging lens can be controlled independently at cross sections in the row and column directions. It is therefore possible to obtain a solid state image pickup device having light converging lenses capable of directing light incident in the row and column directions to the corresponding photosensitive sections.

According to another method of manufacturing a solid state image pickup device of the present invention, a strip layer is formed above a plurality of photosensitive sections disposed in the row direction. A lens shape is formed on the strip layer by using the strip layer, the thickness of the lens form being controlled independently at cross sections in the row and column directions. The lens shape is transferred to form a light converging lens. Therefore, it is possible to obtain a solid state image pickup device having suitable controlled thicknesses at cross sections in the row and column directions.

EMBODIMENTS

A solid state image pickup device according to the first embodiment of the present invention will be described with reference to FIGS. 1A to 1C and FIG. 2.

Figure 1A:
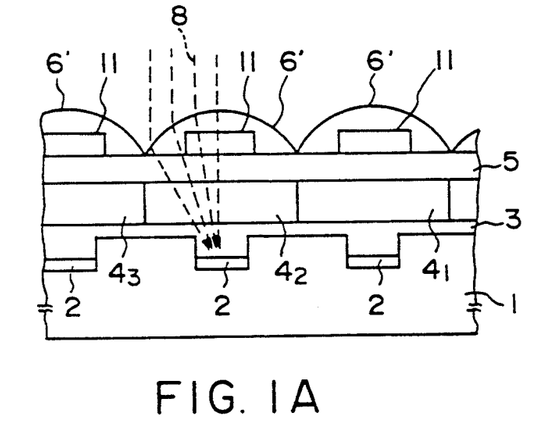
FIG. 1A is a cross sectional view taken along line $A_1-A_{1'}$ a solid state image pickup device according to FIG. 1B is a cross sectional view taken along line $B_1-B_{1'}$ of the solid state image pickup device of the first embodiment.
Figure 1B:
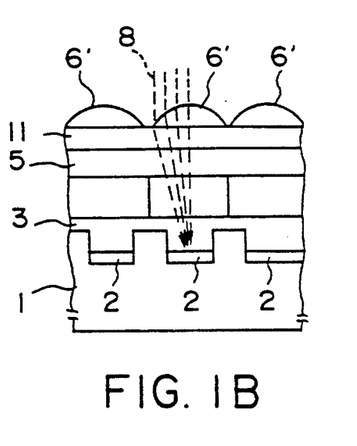
Figure 1C:
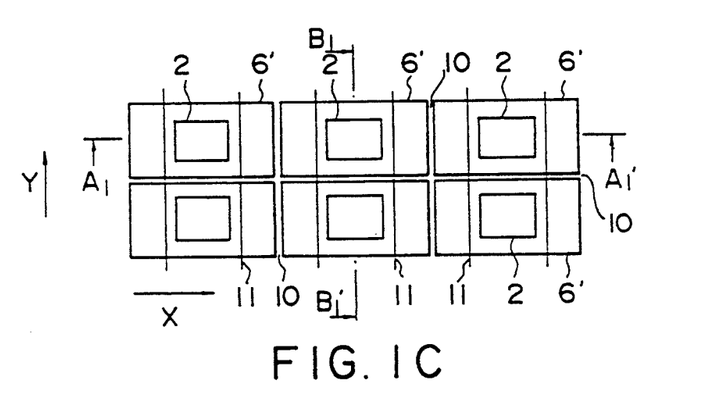
FIG. 1C is a plan view of the solid state image pickup device of the first embodiment.

The plan view of the solid state image pickup device of the first embodiment is shown in FIG. 1C, the cross sectional view along line $A_1-A_{1'}$ is shown in FIG. 1A, and the cross sectional view along line $B_1-B_{1'}$ is shown in FIG. 1B.

The solid state image pickup device of the first embodiment is constructed of the following elements. Namely, it has a plurality of photodiodes 2 formed on the surface of a semiconductor substrate 1 at predetermined areas, a passivation film (protective film) 3 for protecting the photodiodes, color filters $4_1$, $4_2$, and $4_3$ formed on the passivation film 3 for the respective photodiodes 2, a passivation film 5 for protecting the color filters $4_1$, $4_2$, and $4_3$, transparent strip layers 11 formed on the passivation film 5 above the photodiodes 2, and light converging lenses 6' covering the transparent strip layers 11. The photodiodes 2, passivation film 3, color filters $4_1$, $4_2$, and $4_3$, and passivation film 5 are the same as conventional elements, so the description thereof is omitted. The strip layers 11 are made of transparent material and formed running in the Y-direction as seen from FIG. 1C. The cross section of the strip layer 11 along line A—A is rectangular as seen from FIG. 1A. The width of the strip layer 11 in the direction along the longer side of the photodiode 2 (X-direction shown in FIG. 1C) is greater than the width of the photodiode 2 in the X-direction. The length of the strip layer 11 in the Y-direction is set such that it continuously covers a plurality of photodiodes 2 disposed in the Y-direction. Each light converging lens 6' is provided for each photodiode 2, and formed above each strip layer 11. As seen from FIG. 1A, the curvature of the light converging lens 6' at the cross section taken along $A_1-A_{1'}$ is substantially the same as that of a conventional device. However, as seen from FIG. 1B, the curvature of the light converging lens 6' at the cross section along line $B_1-B_{1'}$ is different. Namely, the thickness of the light converging lens 6' at the cross section along line B—B, i.e., the thickness effective for light convergence, is thinner than that of a conventional device. A desired value of curvature of the light converging lens 6' can, therefore, be obtained, and almost all light incident to the light converging lens 6' can be converged to the corresponding photodiode 2.

Figure 2:
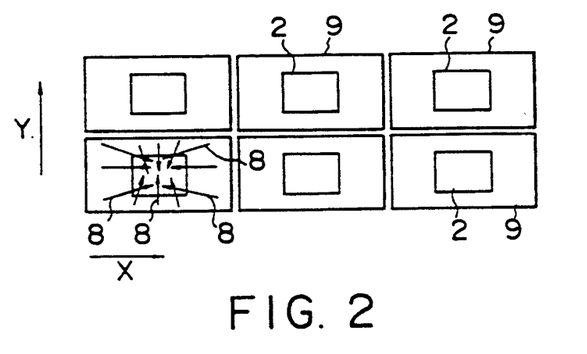
FIG. 2 is a plan view explaining the advantageous effects of the first embodiment.

As a result, as shown in FIG. 2, almost all external light 8 incident to the light converging lens 6' can be converged to the, photodiode 2 not only in the X-direction but also in a Y-direction, i.e., in the omnidirectional manner. Therefore, as compared to a conventional device, an effective light convergence area 9 becomes large, improving the light reception sensitivity.

Furthermore, in the first embodiment, as seen from FIGS. 1A to 1C, two adjacent light converging lenses 6' are disposed as near as possible, and each light converging lens 6' has a curvature allowing almost all light incident to each light converging lens 6' to be converged to the corresponding photodiode 2. Therefore, an area not allowed for external light to be incident to the photodiode 2 can be made small. For example, consider a conventional solid state image pickup device having a pixel dimension of 9.6 $\mu$m width $\times$ 9.6 $\mu$m height and a photodiode dimension of 2 $\mu$m width $\times$ 3 $\mu$m height. In this case, the width of the invalid light convergence area 10 is about 2.0 $\mu$m at the maximum. In contrast, the width of the invalid light convergence area 10 of the solid state image pickup device of the first embodiment, is as small as about 0.5 $\mu$m at the maximum. From the macro viewpoint, almost all the light receiving sections of the solid state image pickup device are substantially covered with a set of light converging lenses 6'. As a result, flare and smear are suppressed, improving the reliability of the solid state image pickup device.

A method of manufacturing the solid state image pickup device of the first embodiment will be described with reference to FIGS. 3A to 3D and FIGS. 4A to 4D.

FIGS. 3A to 3D are cross sectional views along line $A_1-A_{1'}$ of FIG. 1C showing manufacturing processes, and FIGS. 4A to 4D are cross sectional views along line $B_1-B_{1'}$.

Figure 3A:
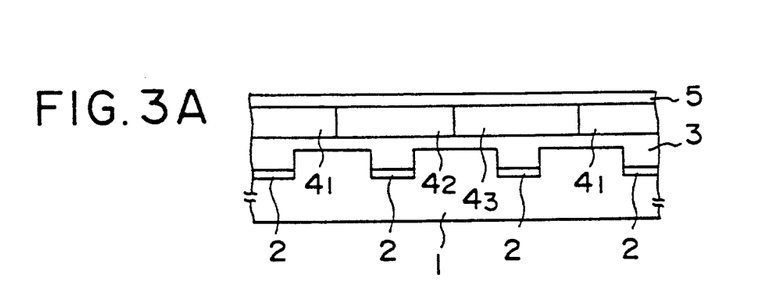
FIGS. 3A-3D and 4A-4D show a method of manufacturing the solid state image pickup device of the first embodiment.
Figure 3B:
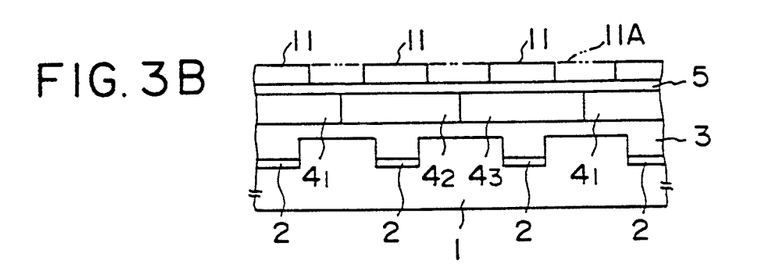

In FIGS. 3A and 3B, conventional manufacturing processes are used until passivation film 5 is formed.

Figure 4A:
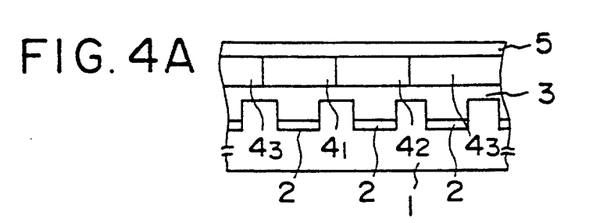
Figure 4B:
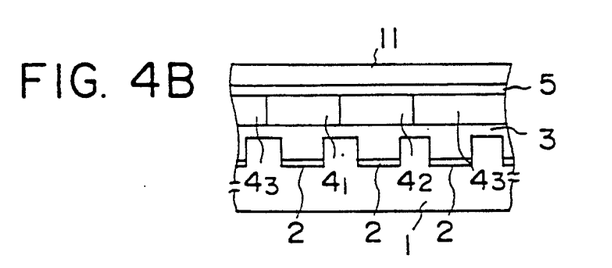

As seen from FIGS. 3B and 4B, a film 11A is formed on the passivation film 5, using styrene based resist or acrylic based resist. This film 11A is patterned to form a plurality of transparent strip layers 11 each having a predetermined dimension and continuously covering a plurality of photodiodes 2, 2, ... disposed in the Y-direction.

Figure 3C:
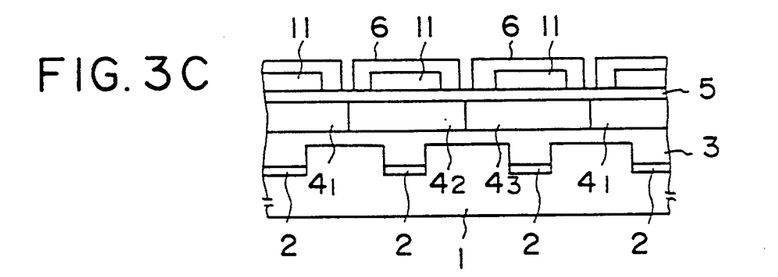
Figure 4C:
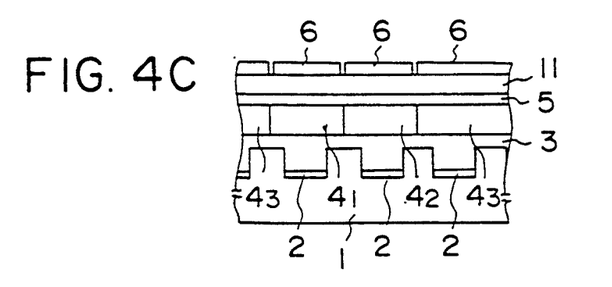

Thereafter, as seen from FIGS. 3C and 4C, a positive photoresist film 6A is formed covering the strip layers 11. The positive photoresist film 6A is patterned in a predetermined shape by means of a photoetching method. Each patterned positive photoresist film 6 is made transparent, for example, by applying light thereto.

Figure 3D:
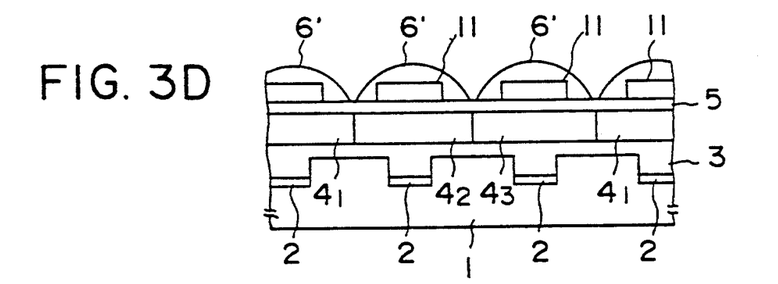
Figure 4D:
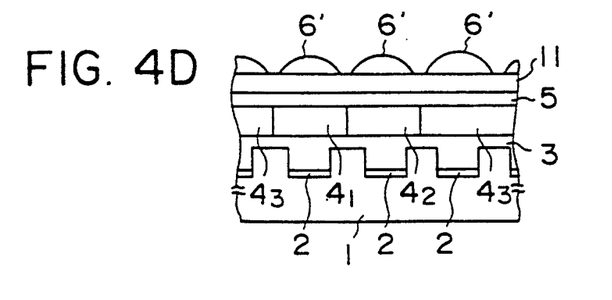

Thereafter, as seen from FIGS. 3D and 4D, light converging lenses 6', 6', ... are formed through thermal deformation.

With the above-described manufacturing method, it is possible to obtain the film thickness of the light converging lens 6' at an area effective for light convergence, different in the X-direction and Y-direction, which the conventional device cannot obtain. In this manner, desired curvatures of the light converging lens 6' can be obtained at all the circumference of the lens. Therefore, almost all light incident to the light converging lens 6' can be converged to the corresponding photodiode 2.

Next, a solid state image pickup device according to the second embodiment of the present invention will be described with reference to FIGS. 5A to 5C. The plan view of the solid state image pickup device of the second embodiment is shown in FIG. 5C, the cross section taken along line $A_2-A_{2'}$ of FIG. 5C is shown in FIG. 5A, and the cross section taken along line $B_2-B_{2'}$ of FIG. 5C is shown in FIG. 5B.

Figure 5A:
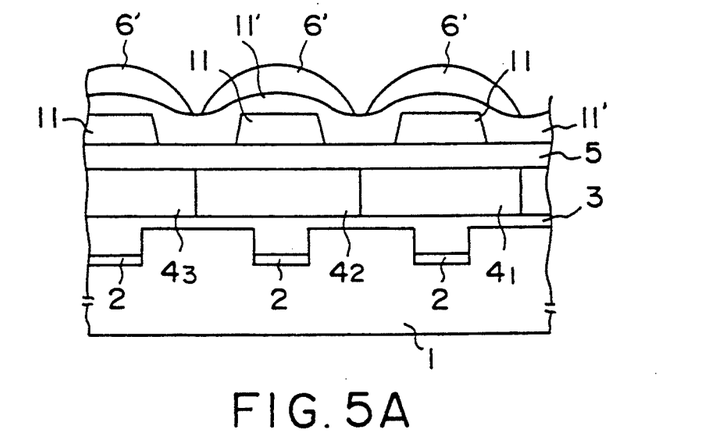
FIG. 5A is a cross sectional view taken along line $A_2-A_{2'}$ of a solid state image pickup device according to a second embodiment of the present invention.
Figure 5B:
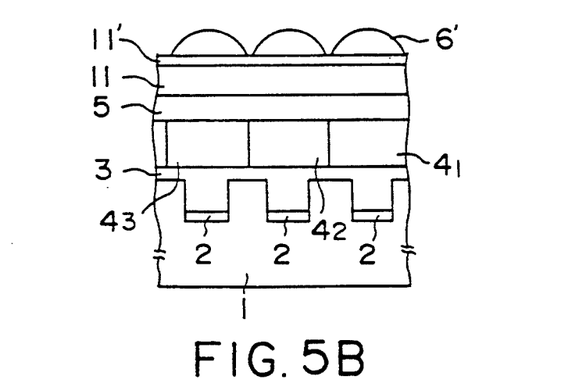
FIG. 5B is a cross sectional view taken along line $B_2-B_{2'}$ of, the solid state image pickup device of the second embodiment.
Figure 5C:
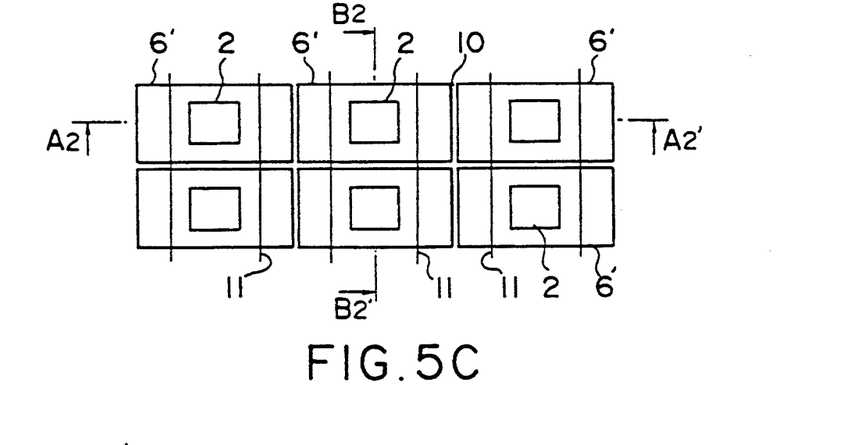
FIG. 5C is a plan view of the solid state image pickup device of the second embodiment.

As seen from FIGS. 5A and 5B, the different points of the second embodiment from the first embodiment reside in that a passivation film 11' made of transparent material for protecting transparent layers 11 is formed between the layers 11 and light converging lenses 6', and that the cross section of the strip layer 11 along line $A_2-A_{2'}$ is made generally of a trapezoidal shape. In the second embodiment, like elements to those of the first embodiment are represented by using identical reference numerals, and the description thereof is omitted.

In the second embodiment, the strip layers 11 are covered with the passivation film 11'. Therefore, as the material of the strip layer 11, it is possible to use styrene based or acrylic based negative photoresist, increasing the degree of freedom of material selection. It is preferable to use, as the material of the passivation layer 11', material which does not intermix with the material of the light converging lens 6'.

Figure 6A:
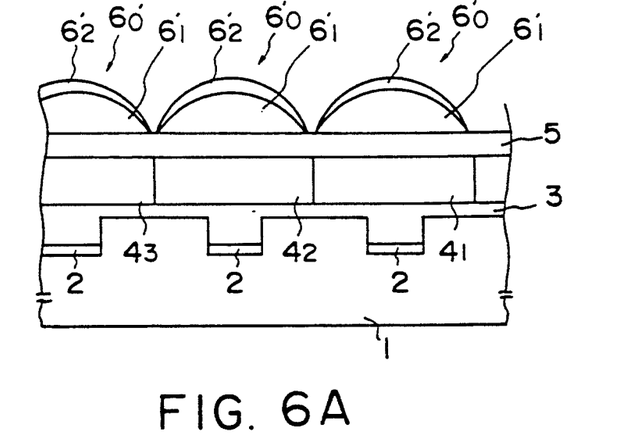
FIG. 6A is a cross sectional view taken along line $A_3-A_{3'}$ of solid state image pickup device according to a third embodiment of the present invention.
Figure 6B:
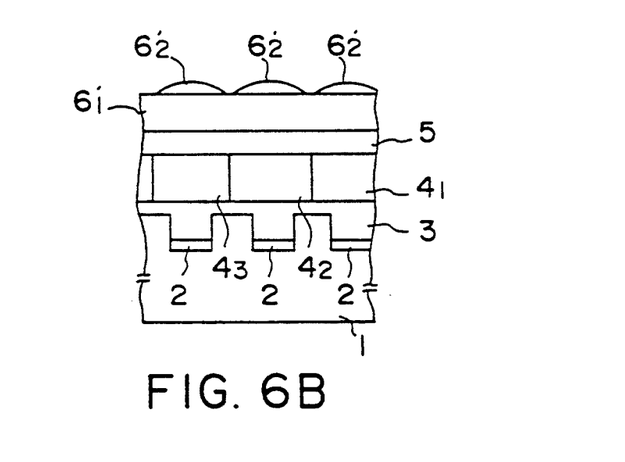
FIG. 6B is a cross sectional view taken along line $B_3-B_{3'}$ of the solid state image pickup device of the third embodiment.
Figure 6C:
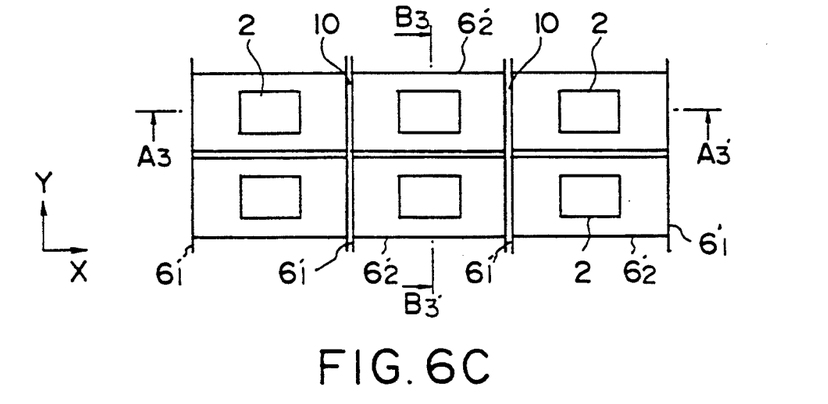
FIG. 6C is a plan view of the solid state image pickup device of the third embodiment.

The solid state image pickup device of the second embodiment can have desired curvature of the light converging lens 6' and the advantageous effects, similar to the first embodiment. Furthermore, the strip layers 11 are covered with the passivation film 11', so that the strip layers 11, particularly their corners, will not be exposed even if the film thickness of the lens 6' becomes thin, as different from the first embodiment, thus improving the reliability of the device. The third embodiment of the present invention is shown in FIGS. 6A to 6C. The plan view of the solid state image pickup device of the third embodiment is shown in FIG. 6C, the cross section taken along line $A_3-A_3'$ of FIG. 6C is shown in FIG. 6A, and the cross section taken along line $B_3-B_3'$ of FIG. 6C is shown in FIG. 6B.

For the solid state image pickup device of the third embodiment, the processes up to forming a passivation film 5 for protecting color filters $4_1$, $4_2$, and $4_3$ are performed in a similar manner to the first embodiment. Thereafter, formed on the passivation film 5 are light converging lenses $6_0$, each constructed of a first light converging lens $6_1$, and a second light converging lens $6_2$. The first light converging lens $6_1$, has a cross section along line $A_3-A_3'$ of generally a crescent moon shape. This lens $6_1$ extends in the Y-direction to cover a plurality of photodiodes 2, 2, . . . disposed in the Y-direction.

The first light converging lens $6_{1'}$ can be considered as a strip layer having a curvature effective for light convergence. As a result, similar to the first and second embodiments, in the third embodiment, the second light converging lenses $6_{2'}$ can be considered as covering the strip layers (first light converging lenses $6_{1'}$). Each second light converging lens $6_{2'}$ covers the first light converging lens $6_{1'}$ for the corresponding photodiode 2. Therefore, the curvature of the light converging lens $6_{0'}$ at the cross section along line $A_3-A_3'$ is determined by the light converging lenses $6_{1'}$ and $6_{2'}$, and the curvature at the cross section along line $B_3-B_3'$ is determined by the light converging lens $6_{2'}$. It is therefore possible to have desired curvatures at the cross sections along line $A_3-A_3'$ and line $B_3-B_3'$. If adjacent two second light converging lenses $6_{2'}$, are disposed as near as possible, the invalid light convergence area 10 can be made small, obtaining the advantageous effects similar to the first embodiment.

In the third embodiment, it is preferable to use as the material of the first light converging lens $6_{1'}$, material which does not intermixed with the material of the second light converging lens $6_{2'}$. For example, material added with thermosetting agent may be used as the material of the first light converging lens $6_{1'}$. Raw material is deformed thermally to obtain the shape of the lens $6_{1'}$ shown in FIG. 6A, and thereafter it is thermally set to form the light converging lens $6_{1'}$. Thereafter, a lens raw material layer is formed on the first light converging lens $6_{1'}$ and etched to form the second light converging lens $6_{2'}$. In this manner, it is possible not to intermix the materials of the first and second light converging lenses $6_{1'}$ and $6_{2'}$.

Also in the third embodiment, the light converging lens $6_{0'}$ is constructed of two-layered lenses $6_{1'}$ and $6_{2'}$, so that it can be made thicker than a single layer lens. A thick single layer poses a problem of a low patterning precision. However, a multi layer lens eliminates this problem.

Figure 7A:
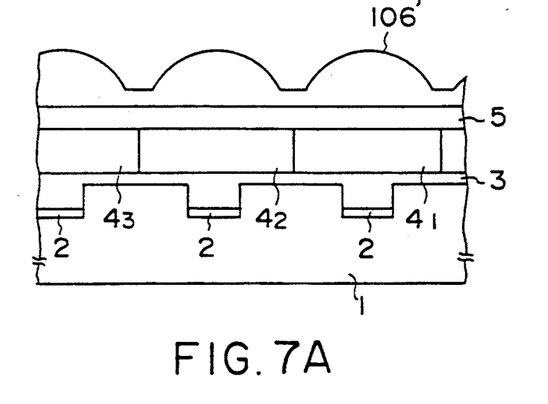
FIG. 7A is a cross sectional view along line $A_4-A_{4'}$ of a solid state image pickup device manufactured by the method of the present invention.
Figure 7B:
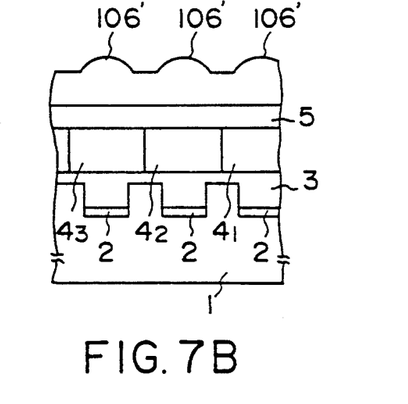
FIG. 7B is a cross sectional view along line $B_4-B_{4'}$ of the solid state image pickup device manufactured by the method of the present invention.
Figure 7C:
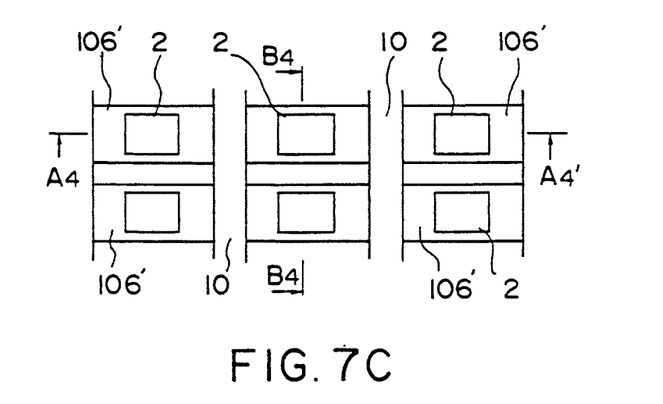
FIG. 7C is a plan view of the solid state image pickup device manufactured by the method of the present invention.

Next, a solid state image pickup device according to the fourth embodiment of the present invention will be described with reference to FIGS. 7A to 7C. The plan view of the solid state image pickup device of the fourth embodiment is shown in FIG. 7C, the cross section taken along line $A_4-A_4'$ of FIG. 7C is shown in FIG. 7A, and the cross section taken along line $B_4-B_4'$ of FIG. 7C is shown in FIG. 7B.

First, the processes of manufacturing the solid state image pickup device of the fourth embodiment will be described with reference to FIGS. 9A to 9E and FIGS. 10A to 10E.

Figure 9A:
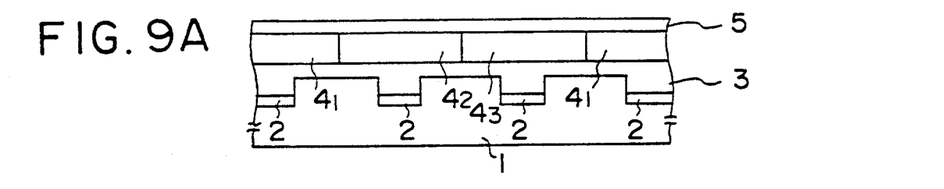
FIGS. 9A to 9E and FIGS. 10A to 10E are cross sectional views showing the processes of manufacturing the solid state image pickup device shown in FIGS. 7A to 7C.
Figure 10A:
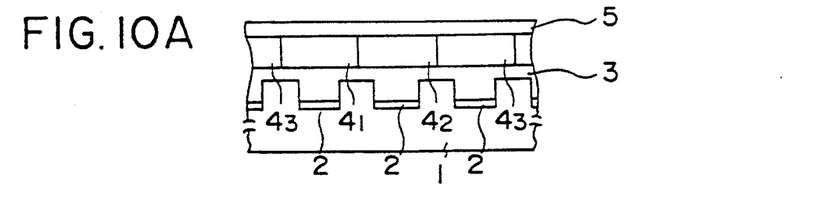

Similar to FIG. 3A, as seen from FIGS. 9A and 10A, formed on a semiconductor substrate 1 are photodiodes 2, passivation film 3, color filters $4_1$, $4_2$, and $4_3$, and passivation film 5.

Figure 9B:
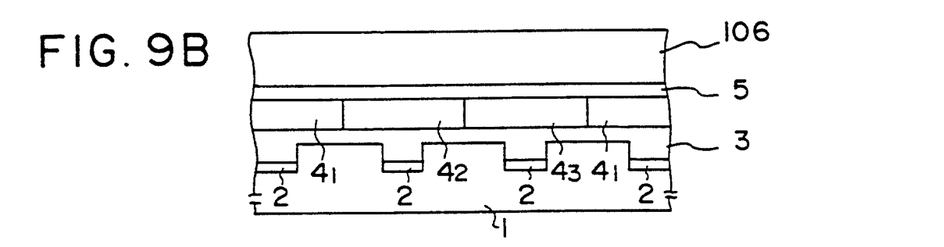
Figure 10B:
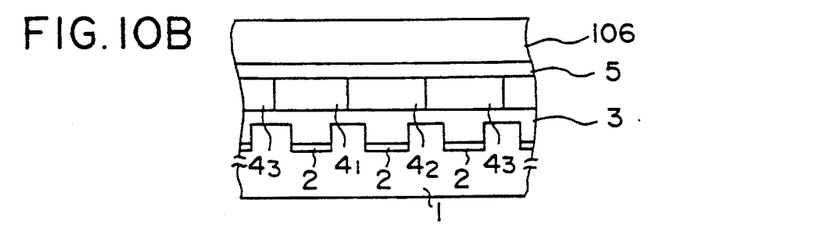

As seen from FIGS. 9B and 10B, a transparent film layer 106 is formed on the passivation film 5.

Figure 9C:
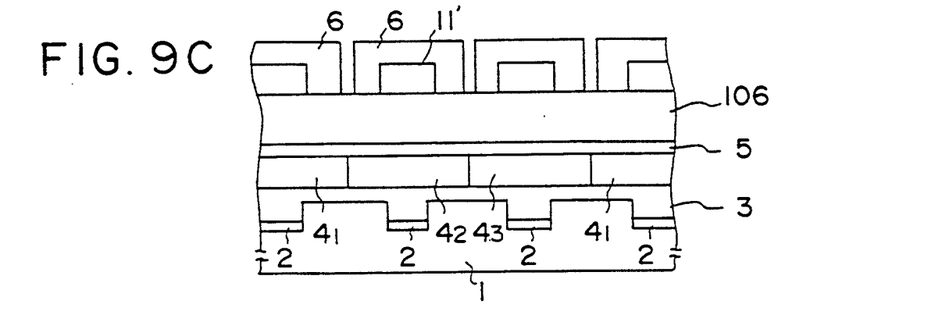
Figures 10C, 10D:
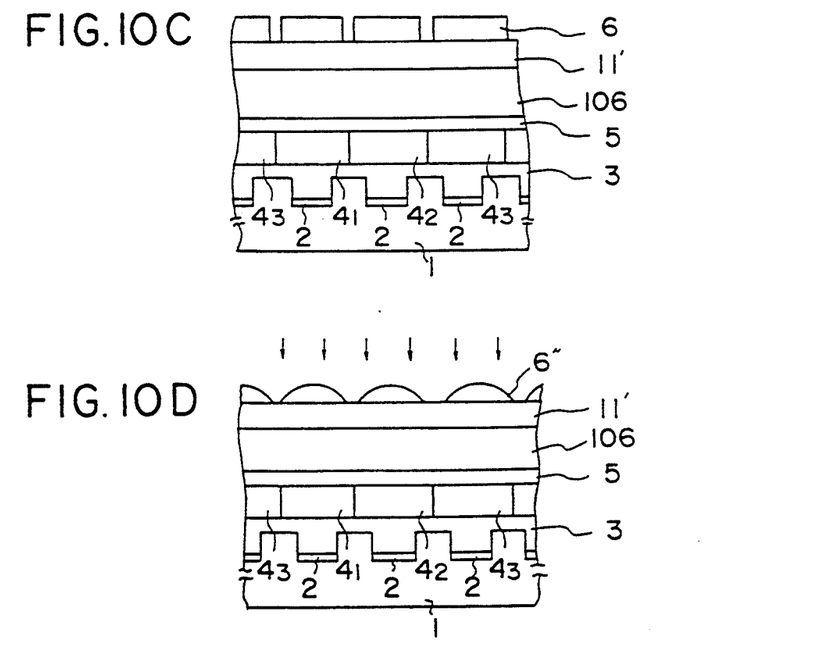

As seen from FIGS. 9C and 10C, strip layers 11' like the strip layers 11 shown in FIG. 3C are formed on the film layer 106. A resist film 6 like the positive photoresist film 6 shown in FIG. 3C is formed on the strip layers 11'.

Figure 9D:
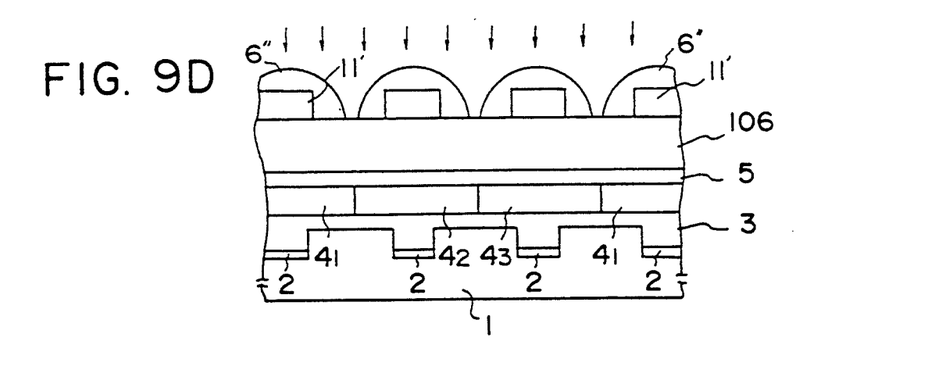

Next, as shown in FIGS. 9D and 10D, the resist film 6 is heated to obtain the lens shape 6". Since the light converging lens is formed at the later process by etching a transparent film, the strip layers 11' and lens shape layer 6" are not necessary to use transparent material. Therefore, the degree of freedom of selecting the material for these layers 11' and 6" can be broaden.

Figure 9E:
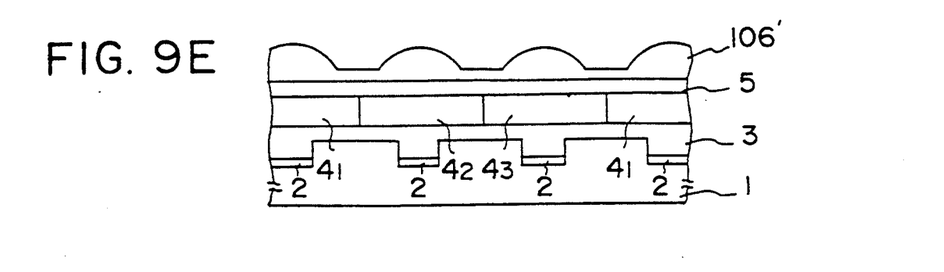
Figure 10E:
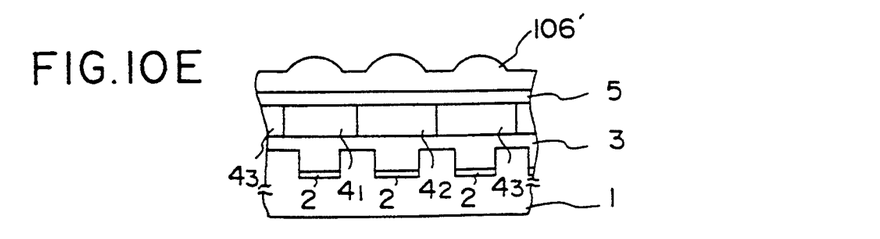

Thereafter, as seen from FIGS. 9E and 10E, anisotropic etching is carried out using $O_2$ RIE for example. The lens shape 6" is therefore transferred to a transparent film layer 106 to form light converging lenses 106'.

Figure 8:
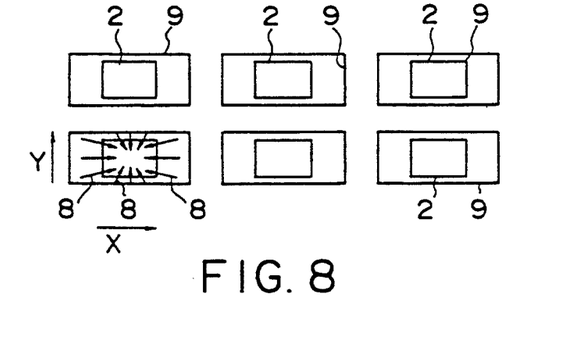
FIG. 8 is a plan view explaining the advantageous effects of the solid state image pickup device shown in FIG. 7.

Similar to the first embodiment, the solid state image pickup device manufactured in the above manner can obtain desired curvatures of the light converging lens 106' at the cross sections along line $A_4-A_4'$ and line $B_4-B_4'$. Therefore, as shown in FIG. 8, almost all light incident to the light converging lens 106' can be converged to the corresponding photodiode 2, considerably improving the light reception sensitivity similar to the first embodiment. In manufacturing a solid state image pickup device, instead of forming strip layers and patterns for light converging lenses as used in the first embodiment, light converging lenses as used in the first embodiment, light converging lenses 106' may be formed by transferring patterns to a transparent film layer by means of anisotropic etching, after forming strip layers and patterns for light converging lenses as used in the second embodiment, or after forming strip layers and patterns for light converging lenses as used in the third embodiment.

In the above embodiments, the cross section of the strip layer has a rectangular shape, trapezoidal shape or crescent moon shape. The present invention is not limited thereto, but any other shape may be used so long as it provides the above-described function of the strip layer.

In the foregoing description, a solid state image pickup device having color filters has been used by way of example. The present invention is not limited thereto. Obviously, the present invention can be applied to solid state image pickup devices without color filters.

I claim:
1. A solid state image sensing device comprising;
   a semiconductor substrate;
   a plurality of solid state image sensing elements formed on said semiconductor substrate, each having photosensitive sections for transducing incident light into an electric charge signal, the photosensitive sections being arranged in a matrix pattern in such a planar shape that a side length in the row direction of each photosensitive section is longer than a side length in the column direction thereof;

a plurality of stripe-shaped layers, each formed of a transparent material and extending in the column direction so as to cover from above the photosensitive sections arranged in each column direction;

a plurality of condenser lenses each formed on each of said stripe-shaped layers at such a position as to cover each of said photosensitive sections from above, each of said condenser lenses being formed so as to cover all peripheral surfaces of each of said stripe-shaped layers when seen in cross section along the row direction and cover only an upper surface of each of said stripe-shaped layers when seen in cross section along the column direction, so that a first curvature of each condenser lens along the row direction is smaller than a second curvature thereof along the column direction, to condense light incident upon each of said condenser lenses onto each of said photosensitive sections irrespective of a difference in length between the row and column directions of the planar shape of each photosensitive section.

2. The solid-state image sensing device according to claim 1, wherein the cross section of each of said stripe-shaped layers in the row direction is roughly rectangular.

3. The solid-state image sensing device according to claim 2, wherein each of said condenser lenses is formed so as to cover all of said peripheral surfaces including an upper surface and both side surfaces of each of said stripe-shaped layers when seen in cross section along the row direction and cover only an upper surface of each of said stripe-shaped layers when seen in cross section along the column direction.

4. The solid-state image sensing device according to claim 1, wherein each of said stripe-shaped layers is roughly semicircularly shaped in cross section along the row direction.

5. The solid-state image sensing device according to claim 4, wherein each of said condenser lenses is formed so as to cover the whole circular arc-shaped peripheral surface of each of said stripe-shaped layer when seen in cross section along the row direction and cover only a ridgeline portion of the circular arc-shaped peripheral surface of each of said stripe-shaped layers when seen in cross section along the column direction.

6. The solid-state image sensing device according to claim 1, which further comprises a plurality of color filters, each formed between each of said condenser lenses and each of the photosensitive sections.

7. The solid-state image sensing device according to claim 3, which further comprises a plurality of color filters, each formed between each of said condenser lenses and each of the photosensitive sections.

8. The solid-state image sensing device according to claim 5, which further comprises a plurality of color filters, each formed between each of said condenser lenses and each of the photosensitive sections.

9. The solid-state image sensing device according to claim 6, which further comprises a transparent protective film layer formed between each of said condenser lenses and each of said stripe-shaped layers, to cover and protect all of said stripe-shaped layers in common.

10. The solid-state image sensing device according to claim 7, which further comprises a transparent protective film layer formed between each of said condenser lenses and each of said stripe-shaped layers, to cover and protect all of said stripe-shaped layers in common.

11. The solid-state image sensing device according to claim 8, which further comprises a transparent protective film layer formed between each of said condenser lenses and each of said stripe-shaped layers, to cover and protect all of said stripe-shaped layers in common.

* * * * *